(12) United States Patent
Harvey

(10) Patent No.: US 6,538,514 B2
(45) Date of Patent: Mar. 25, 2003

(54) COMPENSATION METHOD IN A CLASS-G AMPLIFIER OUTPUT STAGE

(75) Inventor: Barry A. Harvey, Los Altos, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 10/153,837

(22) Filed: May 22, 2002

(65) Prior Publication Data

US 2002/0175760 A1 Nov. 28, 2002

Related U.S. Application Data

(60) Provisional application No. 60/292,818, filed on May 22, 2001.

(51) Int. Cl.[7] .............................. H03H 11/26; G06F 1/04
(52) U.S. Cl. ........................ 330/265; 330/263; 330/267; 330/292
(58) Field of Search ................................ 330/263, 269, 330/267, 268, 292, 265

(56) References Cited

U.S. PATENT DOCUMENTS

| | | | |
|---|---|---|---|
| 3,887,878 A | 6/1975 | Schade, Jr. .................. 330/13 |
| 4,205,273 A | 5/1980 | Yoshida ...................... 330/251 |
| 4,688,001 A | * 8/1987 | Dijkmans et al. ........... 330/273 |
| 4,706,039 A | * 11/1987 | Dijkmans et al. ........... 330/297 |
| 5,315,266 A | * 5/1994 | Lorenz ....................... 330/294 |
| 5,859,568 A | * 1/1999 | Le et al. ..................... 330/289 |
| 6,184,750 B1 | 2/2001 | Somerville .................. 330/255 |
| 6,236,273 B1 | 5/2001 | Lewyn ........................ 330/297 |

* cited by examiner

Primary Examiner—Patricia Nguyen
(74) Attorney, Agent, or Firm—Fliesler Dubb Meyer & Lovejoy, LLP

(57) ABSTRACT

An improved class-G amplifier (FIG. 2) is provided by adding a first capacitor (82) between the input of current mirror (18) and node p, and by adding a second capacitor (84) between the input of current mirror (20) and node m. The added capacitors (82) and (84) can be sized to stabilize frequency responses when high power supplies are enabled. The added capacitors (82) and (84) further function to reduce transient currents during switching through the crossover points between first upper and lower power supplies (Vsp1, Vsph) and between second upper and lower power supplies (Vsm1, Vsmh).

10 Claims, 2 Drawing Sheets

COMPENSATION METHOD IN A CLASS-G AMPLIFIER OUTPUT STAGE

CROSS REFERENCE TO PROVISIONAL APPLICATION

This application claims priority to provisional application SC/Ser. No. 60/292,818, entitled "A Compensation Method In A Class-G Amplifier Output Stage" filed May 22, 2001.

BACKGROUND

1. Technical Field

The present invention relates to class-G amplifiers. More particularly, the present invention relates to a compensation technique for a class-G amplifier that stabilizes frequency responses and greatly reduces the transient created by traversing the switching points between a low power supply and a high power supply.

2. Related Art

Class-G amplifiers operate to change the power supply voltage from a lower level to a higher level when larger output swings are required. Class-G operation is often implemented with a single class-AB output stage that is connected to two power supply rails by a diode, or a transistor switch. The design is such that the output stage is connected to the lower supply voltage, and automatically switches to the higher power supply rails for large signal peaks. Another approach involves the use of two class-AB output stages, each connected to a different power supply voltage, with the magnitude of the input signal determining the signal path. Using two power supplies improves efficiency enough to allow significantly more power for a given size and weight.

FIG. 1 shows a schematic diagram of a typical class-G current feedback amplifier. The input stage of the amplifier of FIG. 1 includes transistors 2, 4, 6, and 8, and current sinks 10 and 12. The collector terminals of transistors 2 and 4 are connected directly to an upper high voltage power supply terminal Vsph and a lower high voltage power supply terminal Vsmh, respectively. The emitter terminal of transistor 2 is connected through a current sink 12 to Vsmh, while the emitter terminal of transistor 4 is connected through a current sink 10 to Vsph. The base terminals of transistors 2 and 4 are connected together and form the non-inverting input (+input) of the class-G amplifier. Transistor 6 has a collector terminal connected to the input of a pull-up current mirror 18, an emitter forming the inverting input (−input) of the class-G amplifier, and a base terminal connected to the emitter terminal of transistor 4. Transistor 8 is connected in an emitter follower configuration with transistor 6, with a collector terminal connected to pull-down current mirror 20, and a base terminal connected to the emitter terminal of transistor 2.

The output stage of the class-G amplifier of FIG. 1 includes current mirrors 18 and 20, transistors 30, 32, 34, and 36, diodes 14, 16, 38 and 40, and voltage supplies 26 and 28. The collector of transistor 30 is connected to Vsph, while the collector of transistor 36 is connected to Vsmh. The emitters of transistors 30 and 36 are connected to the collector terminals of common emitter transistors 32 and 34, respectively. The base of transistor 30 is connected through the voltage supply 26 to the output of the class-G amplifier, while the base of transistor 36 is connected through a voltage supply 28 to the output of the class-G amplifier. Transistor 32 has a base connected to the output of pull-up current mirror 18, while the base of transistor 34 is connected to the output of pull-down current mirror 20. A first low voltage power supply Vsp1 is connected through diode 38 to the collector of transistor 32 at node p, while a second low voltage power supply Vsm1 is through diode 40 to the collector of transistor 34 at node m. Capacitors 22 (CBCp) and 24 (CBCm) represent the parasitic capacitance that loads the terminals of diodes 14 and 16. A feedback resistor 42 is typically connected from the output of the class-G amplifier to the inverting input (−input).

The amplifier of FIG. 1 operates as a class-G amplifier in that the collector voltages of transistors 32 and 34 are provided by one of transistor 30 and diode 38, or one of transistor 36 and diode 40, respectively. That is for small output voltages the diodes 38 and 40 are forward biased and load current flows through diode 38 or 40, and transistors 30 and 36 are biased off. When the output voltage exceeds Vsp1+VBE−VD−$V_{Bp}$ for positive swing (where VBE is the base to emitter voltage of transistor 30, VD is the diode voltage for diode 38, and $V_{Bp}$ is the voltage supply 26 voltage) or −Vsm1+VBE+VD+$V_{Bm}$ for negative swings (where VBE is the base to emitter voltage of transistor 34, VD is the diode voltage for diode 40, and $V_{Bm}$ is the voltage supply 28 voltage), transistor 30 or 36 will turn on and divert output current from one of the low voltage supplies VspL or Vsm1 toward one of the high voltage supplies Vsph or Vsmh. Thus, small signals at the output will cause current to be drawn from the low supplies. In the case of Digital Subscriber Line (DSL) waveforms, only 1–3% of signal swings will draw power from the high supplies, and overall power consumption is minimized.

At low output levels, the dominant compensation pole for the amplifier of FIG. 1 is at $1/(2\ R_F*(CBCP+CBCm))$, where $R_F$ is the value of feedback resistor 42. The voltage at the collectors of transistors 32 and 34 does not move much with small outputs, so capacitors 22 (CBCp) and 24 (CBCm) load the "gain node" between the terminals of diodes 14 and 16. When large outputs occur, however, transistors 30 and 36 drive the collectors of transistors 32 and 34. For large positive outputs, for instance, transistor 30 provides a voltage at the collector of transistor 32 that follows the output. Thus, capacitor 22 is now driven with similarly changing voltages at both terminals and draws almost no AC current. Capacitor 22 therefore no longer adds its capacitance as compensation in the above equation. The fed-back pole is moved upward in frequency. A similar operation occurs with large negative outputs. With a large negative output, transistor 36 provides a voltage at the collector of transistor 34 that follows the output. Thus, capacitor 24 is now driven with similarly changing voltages at both terminals and draws almost no AC current. Capacitor 24 therefore no longer adds its capacitance as compensation.

Unfortunately, at the higher pole frequency additional phase lag exists in the current mirrors and all other transistors, and the circuit is more likely to oscillate. Additionally, a sudden change in frequency response occurs in this supply crossover region, causing a transient response with each traversal of the region. This leads to higher output distortion.

SUMMARY

In accordance with the present invention, referring to FIG. 2, an improved Class-G amplifier is provided by adding a first capacitor 82 between the input of current mirror 18 and node p, and by adding a second capacitor 84 between the input of current mirror 20 and node m. The added capacitors 82 and 84 can be sized to stabilize frequency responses when high power supplies are enabled. The added capacitors 82 and 84 further function to reduce transient currents during switching through the crossover points between upper and lower power supplies.

BRIEF DESCRIPTION OF THE DRAWINGS

Further details of the present invention are explained with the help of the attached drawings in which.

DETAILED DESCRIPTION

Figure 1:
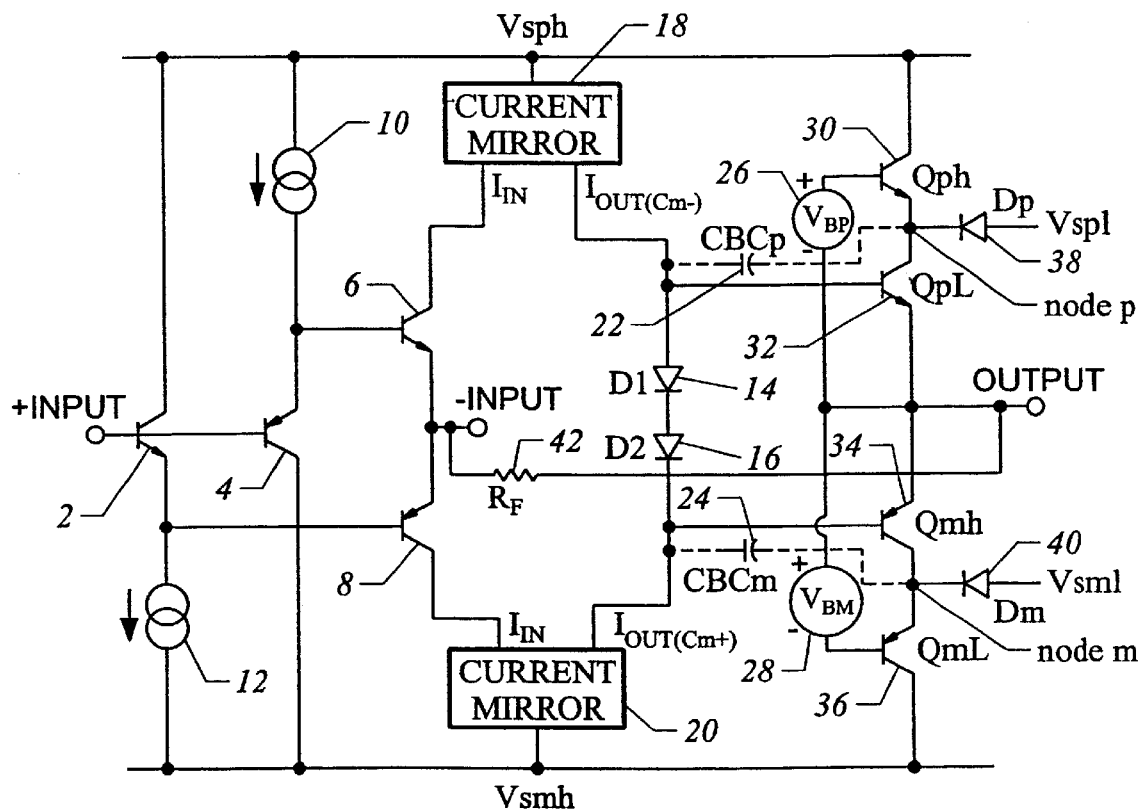
FIG. 1 shows a schematic diagram depicting a typical class-G current feedback amplifier.
Figure 2:
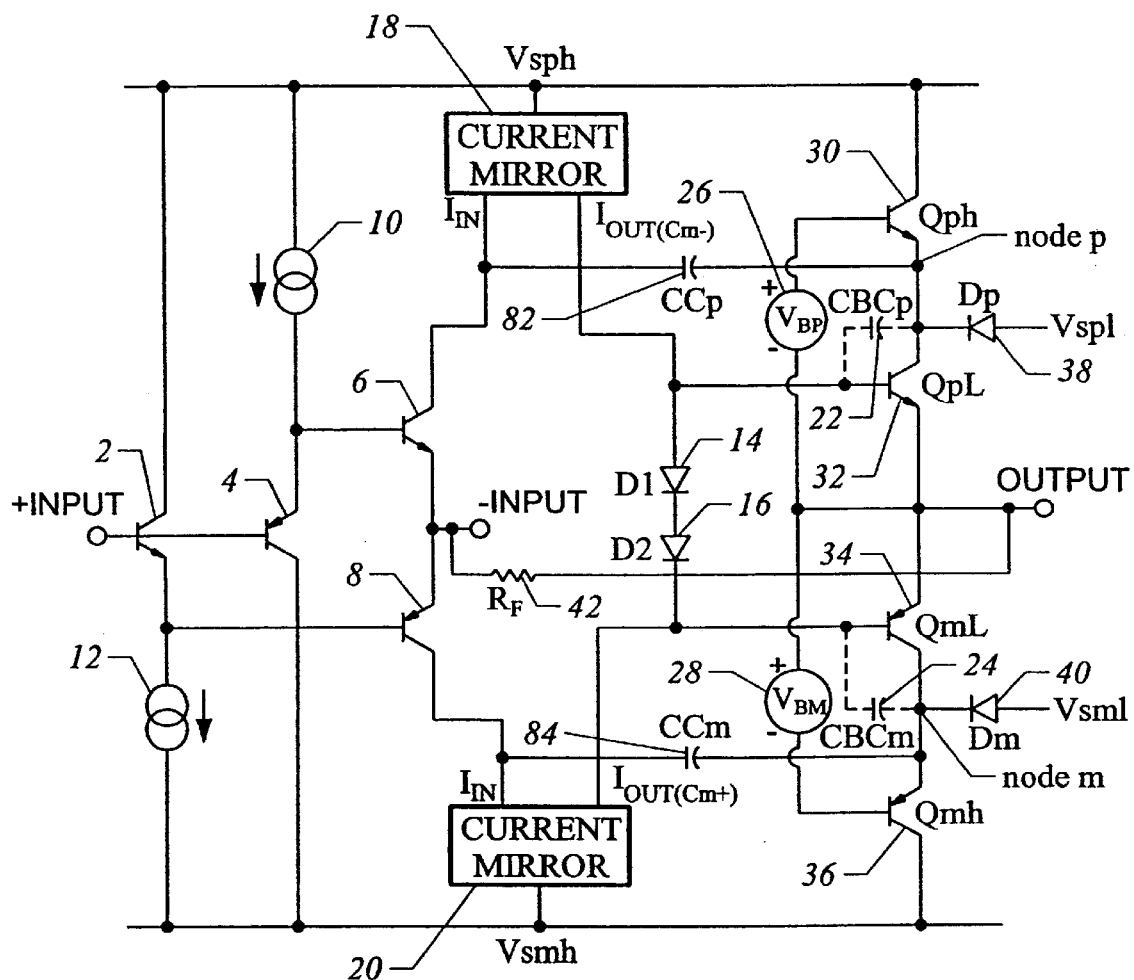
FIG. 2 shows a schematic diagram depicting a class-G current feedback amplifier in accordance with the present invention.

FIG. 2 depicts a general overview of a Class-G current feedback amplifier in accordance with the present invention. As shown in FIG. 2, capacitors 82 (CCp) and 84 (CCm) have been added to amplifier shown in FIG. 1. Components carried over from FIG. 1 to FIG. 2 are similarly labeled in FIG. 2. As in FIG. 1, with the amplifier of FIG. 2, at low output levels, the dominant compensation pole for the amplifier is at $1/(2 R_F*(CBCP+CBCm))$, where $R_F$ is the value of feedback resistor 42.

When the output signal is small, the collectors of transistors 32 and 34 are clamped by diodes 38 and 40 and the right-hand connections of capacitors 82 and 84 have nearly no moving voltage. Capacitors 82 and 84 then just are in AC parallel with the current mirror inputs. Current mirrors 18 and 20 can be designed to have low input impedance, so the loading of capacitors 82 and 84 does not greatly affect overall frequency response. In this regime of signal, capacitors 22 (CBCp) and 24 (CBCm) dominate the frequency response.

If the output waveform goes positive beyond the Vsp1+ VBE−VD−VBP threshold (where VBE is the base to emitter voltage of transistor 30, VD is the diode voltage for diode 38, and $V_{Bp}$ is the voltage supply 26 voltage) then transistor 30 steers supply current away from diode 38, and node p thus follows the output variation. The right-hand terminal of capacitor 82 then moves with the signal, and functions as a Miller capacitor with respect to pull-up current mirror 18. Now the compensation is controlled by capacitor 82 and the compensation contribution of capacitor 22 is switched out. Capacitor 82 can be sized so that the frequency response of the overall circuit is relatively constant for positive output swings on either side of the positive switching threshold.

Similarly, if the output waveform goes negative beyond the −VsmL−VBE+VD+VBm threshold (where VBE is the base to emitter voltage of transistor 36, VD is the diode voltage for diode 40, and $V_{Bm}$ is the voltage from voltage supply 28) then transistor 36 steers supply current away from diode 40, and node m thus follows the output variation. The right-hand terminal of capacitor 84 then moves with the signal, and functions as a Miller capacitor with respect to pull-down current mirror 20. Now the compensation is controlled by capacitor 84 and the compensation contribution of capacitor 24 is switched out. As with capacitor 82, capacitor 84 can be sized so that the frequency response of the overall circuit is relatively constant for negative output swings on either side of the negative switching threshold.

Beyond stabilizing frequency responses, this compensation technique greatly reduces the transient created by traversing the switching points.

Although FIG. 2 shows use of bipolar junction transistors (BJT) making up the class-G amplifier, the capacitors 82 and 84 used in accordance with the present invention can also be used with an amplifier formed with CMOS transistors. Similarly, although the BJT transistors are shown with particular transistor types, such as NPN transistor 2 and PNP transistor 4, a configuration of the class-G amplifier can be made with the transistors types exchanged, while still using capacitors 82 and 84 in accordance with the present invention. Further, although current sink 10 is shown connected between the first high power supply Vsph and transistor 4, while current sink 12 is connected between the second high power supply Vsmh and transistor 2, the location of current sinks 10 and 12 can be switched so that current sink 10 is connected between transistor 4 and Vsmh, while current sink 12 is connected between transistor 2 and Vsph.

Although the present invention has been described above with particularity, this was merely to teach one of ordinary skill in the art how to make and use the invention. Many additional modifications will fall within the scope of the invention, as that scope is defined by the claims which follow.

What is claimed is:

1. An output stage for a Class-G Amplifier comprising:

a first current mirror (18) having an input ($I_{IN}$) driven by a first half cycle of an input signal provided to an input of the of the Class-G amplifier, and having an output ($I_{OUT}$(Cm−));

a second current mirror (20) having an input ($I_{IN}$) driven by a second half cycle of an input cycle provided to the input of the Class-G amplifier, and having an output ($I_{OUT}$(Cm+));

series connected diodes (14) connected between the outputs of the first and second current mirrors (18,20);

a pair of emitter follower transistors (32,34) having common emitters forming an output (output) of the amplifier, a first one of the pair of emitter follower transistors (32) having a base connected to the output ($I_{OUT}$(Cm−)) of the first current mirror (18) and a collector forming a node p, and a second one of the pair of emitter follower transistors (34) having a base connected to the output ($I_{OUT}$(Cm−)) of the second current mirror (20) and a collector forming a node m;

a first voltage source (26) having a negative terminal connected to the output of the amplifier, and having a positive terminal;

a second voltage source (28) having a positive terminal connected to the output of the amplifier, and having a negative terminal;

a first low voltage control diode (38) having a first terminal connected to a first low voltage power supply terminal (Vsp1), and a second terminal connected to the node p;

a first high voltage control transistor (30) having a collector-emitter path connecting the node p to the first high power supply terminal (Vsph), and having a base connected to the positive terminal of the first voltage source (26);

a second low voltage control diode (40) having a first terminal connected to a second low voltage power supply terminal (Vsm1), and having a second terminal connected to the node m;

a second high voltage control transistor (36) having a collector-emitter path connecting the node m to the second high power supply terminal (Vsmh), and having a base connected to the negative terminal of the second voltage source (28);

a first compensation capacitor (82) having a first terminal connected to the input of the first current mirror (18) and a second terminal connected to the node p; and a second compensation capacitor (84) having a first terminal connected to the input of the second current mirror (20) and a second terminal connected to the mode m.

2. A Class-G amplifier comprising:

an input stage for receiving a signal input to the Class-G amplifier and providing a first output and a second output; and an output stage comprising:

a pair or current mirrors (18,20) comprising a first current mirror (18) receiving the first output of the input stage and having a first current mirror output, and a second current mirror (20) receiving the second output of the input stage and having a second current mirror output;

a pair of diodes (38,40) comprising a first diode (38) connecting a first low voltage supply terminal (Vsp1) to a signal node p providing a first voltage to the output of the Class-G amplifier, and a second diode (40) connecting a second low voltage supply terminal (Vsp1) to a signal node m for providing a second voltage to the output of the Class-G amplifier;

a pair of transistors (32,34) comprising a first transistor (32) connecting a first high voltage supply terminal (Vsph) to the signal node p as controlled by a first voltage offset from the Class-G amplifier output, and a second transistor (34) connecting a second high voltage supply terminal (Vsmh) to the signal node m as controlled by a second voltage offset from the Class-G amplifier output; and a pair of compensation capacitors (82,84) comprising a first compensation capacitor (82) connecting the first current mirror output to the node p, and a second compensation capacitor (84) connecting the second current mirror output to the node m.

3. The Class-G amplifier of claim 2, wherein the first transistor (32) and the second transistor (34) of the pair of transistors (32,34) comprise CMOS devices.

4. The Class-G amplifier of claim 2, wherein the first transistor (32) and the second transistor (34) of the pair of transistors (32,34) comprise BJT devices.

5. The Class-G amplifier of claim 2, wherein the input stage comprises:

a first transistor (2) having a collector-emitter path connected between a first high voltage power supply terminal (Vsph) and a second high voltage power supply terminal (Vsmh), and having a base forming a first input (+input) of the amplifier;

a second transistor (4) having a collector-emitter path connected between the first high voltage power supply terminal (Vsph) and the second high voltage power supply terminal (Vsmh), and having a base connected to the first input (+input) of the amplifier; and a first pair of emitter follower transistors (6,8) having common emitters forming a second input (−input) of the amplifier, and collectors connected between the inputs of the first and second current mirrors (18,20), wherein a base of a first one (8) of the first pair of emitter follower transistors is connected to the emitter of the first transistor (2), while a base of a second one of the first pair of emitter follower transistors (6) is connected to the emitter of the second transistor (4).

6. The Class-G amplifier of claim 5, further comprising:

a feedback resistor (42) connecting the output of the amplifier to the second input (−input) of the amplifier.

7. The amplifier of claim 5, further comprising:

a first current sink (12) coupling the first high power supply terminal (Vsph) to the emitter of the second transistor; and a second current sink (10) coupling the second high power supply terminal (Vsmh) to the emitter of the first transistor (12).

8. An amplifier comprising:

a first transistor (2) having a collector-emitter path connected between a first high voltage terminal (Vsph) and a second high voltage terminal (Vsmh), and having a base forming a first input (+input) of the amplifier;

second transistor (4) having a collector-emitter path connected between the first high voltage terminal (Vsph) and the second high voltage terminal (Vsmh), and having a base connected to the first input (+input) of the amplifier;

a first current mirror (18) having an input ($I_{IN}$) and an output ($I_{OUT}$(Cm−));

a second current mirror (20) having an input (IN) and an output ($I_{OUT}$(Cm+));

a first pair of emitter follower transistors (6,8) having common emitters forming a second input (−input) of the amplifier, and collectors connected between the inputs of the first and second current mirrors (18,20), wherein a base of a first one of the first pair of emitter follower transistors (8) is connected to the emitter of the first transistor (2), while a base of a second one to of the first pair of emitter follower transistors (6) is connected to the emitter of the second transistor (4);

series connected diodes (14,16) connected between the outputs of the first and second current mirrors (18,20);

a second pair of emitter follower transistors (32,34) having common emitters forming an output (output) of the amplifier, a first one of the second pair of emitter follower transistors having a base connected to the output ($I_{OUT}$(Cm−) of the first current mirror (18) and a collector forming a node p, and a second one of the second pair of emitter follower transistors having a base connected to the output ($I_{OUT}$(Cm−)) of the second current mirror (20) and a collector forming a node m;

a first voltage source (26) having a negative terminal connected to the output of the amplifier, and having a positive terminal;

a second voltage source (28) having a positive terminal connected to the output of the amplifier, and having a negative terminal;

a first low voltage control diode (38) having a first terminal connected to a first low voltage power supply terminal (Vsp1), and a second terminal connected to the node p;

a first high voltage control transistor (30) having a collector-emitter path connecting the node p to the first high voltage power supply terminal (Vsph), and having a base connected to the positive terminal of the first voltage source (26);

a second low voltage control diode (40) having a first terminal connected to a second low voltage power supply terminal (Vsm1), and having a second terminal connected to the node m;

a second high voltage control transistor (36) having a collector-emitter path connecting the node m to the second high power supply terminal (Vsmh), and having a base connected to the negative terminal of the second voltage source (36);

a first compensation capacitor (82) having a first terminal connected to the input of the first current mirror (18) and a second terminal connected to the node p; and a second compensation capacitor (84) having a first terminal connected to the input of the second current mirror (20) and a second terminal connected to the mode m.

9. The amplifier of claim 8, further comprising:

a feedback resistor (42) connecting the output of the amplifier to the second input (−input) of the amplifier.

10. The amplifier of claim 9, further comprising:

a first current sink (12) coupling the first high power supply terminal (Vsph) to the emitter of the second transistor; and a second current sink (10) coupling the second high power supply terminal (Vsmh) to the emitter of the first transistor (12).

* * * * *